United States Patent
Zhang

(10) Patent No.: US 10,177,007 B1
(45) Date of Patent: Jan. 8, 2019

(54) METHOD FOR FORMING LOW-TEMPERATURE POLYSILICON DEVICE AND METHOD FOR PLANARIZING POLYSILICON LAYER

(71) Applicant: Wuhan China Star Optoelectronics Semiconductor Display Technology Co., Ltd., Wuhan, Hubei (CN)

(72) Inventor: Weibin Zhang, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/910,529

(22) Filed: Mar. 2, 2018

Related U.S. Application Data

(63) Continuation of application No. PCT/CN2017/114080, filed on Nov. 30, 2017.

(30) Foreign Application Priority Data

Oct. 31, 2017 (CN) .......................... 2017 1 1045283

(51) Int. Cl.
H01L 21/321 (2006.01)
H01L 21/3065 (2006.01)
H01L 21/308 (2006.01)
H01L 21/311 (2006.01)
H01L 21/306 (2006.01)
(Continued)

(52) U.S. Cl.
CPC .... H01L 21/32115 (2013.01); H01L 21/3065 (2013.01); H01L 21/3081 (2013.01); H01L 21/3085 (2013.01); H01L 21/30604 (2013.01); H01L 21/31133 (2013.01); H01L 21/31138 (2013.01); H01L 21/02667 (2013.01); H01L 29/6675 (2013.01)

(58) Field of Classification Search
CPC .................................................. H01L 21/32115
USPC ......................................................... 438/697
See application file for complete search history.

(56) References Cited

U.S. PATENT DOCUMENTS

| 4,311,546 A | 1/1982 | Abe et al. |
| 6,503,848 B1 * | 1/2003 | Chan ................. H01L 21/31055 438/780 |

FOREIGN PATENT DOCUMENTS

| CN | 102874748 A | 1/2013 |
| CN | 104485276 A | 4/2015 |

(Continued)

*Primary Examiner* — Roberts P Culbert
(74) *Attorney, Agent, or Firm* — Hauptman Ham, LLP

(57) ABSTRACT

A method for planarizing a polysilicon layer of a low-temperature polysilicon device is provided. The method includes: Step S1: Crystallizing the low-temperature polysilicon device. Step S2: Forming a flat coating layer on an uneven surface of the polysilicon layer of the crystallized low-temperature polysilicon device through a coating process. Step S3: Curing the flat coating layer. Step S4: Removing the cured flat coating layer and the polysilicon protrusion through a removing process to form a flat surface of the polysilicon layer. By the foregoing method, the surface of the rough and uneven polysilicon layer can be well-planarized. As a result, the problems of a broken film, unclean etching, or tip discharge, which would be induced by a rough polysilicon layer, are mitigated. Therefore, the production yield of the low-temperature polysilicon device is improved.

14 Claims, 4 Drawing Sheets

(51) Int. Cl.
 *H01L 21/02* (2006.01)
 *H01L 29/66* (2006.01)

(56) References Cited

FOREIGN PATENT DOCUMENTS

| | | |
|---|---|---|
| CN | 104752203 A | 7/2015 |
| CN | 105140114 A | 12/2015 |
| CN | 106783582 A | 5/2017 |

* cited by examiner

METHOD FOR FORMING LOW-TEMPERATURE POLYSILICON DEVICE AND METHOD FOR PLANARIZING POLYSILICON LAYER

RELATED APPLICATIONS

The disclosure is a National Phase of International Application Number PCT/CN2017/114080, filed on Nov. 30, 2017, and claims the priority of China Application No. 201711045283.1, filed on Oct. 31, 2017, the entirety of which is incorporated by reference herein.

FIELD OF THE DISCLOSURE

The disclosure relates to a technical field of fabricating a low-temperature polysilicon (polycrystalline silicon) device, and more particularly to a method for forming a low-temperature polysilicon device and a method for planarizing a polysilicon layer.

BACKGROUND

The existing low-temperature polysilicon devices are devices with extremely-fine structure and electrical properties. Each film is required to have high quality. In the prior art, a polysilicon layer is deposited on a $SiO_2$ layer by a vapor deposition method. The polysilicon layer of the device is then crystallized. However, during the crystallization of the polysilicon layer, two adjacent grains extrude each other to form protrusions when they grow up. The larger the grains are or the more the intersecting grain boundaries are, the higher the protrusion is and the larger the surface roughness is. As a result, there would be the problems of a broken film, unclean etching, or tip discharge in the subsequent process. Accordingly, the production yield of the low-temperature polysilicon device products is reduced.

SUMMARY

The disclosure intends to, at least to some extent, solve one of the above technical problems or at least provide a useful business choice. Therefore, an objective of the disclosure is to provide a method for planarizing a polysilicon layer of a low-temperature polysilicon device. It aims to mitigate the problems of a broken film, unclean etching, or tip discharge, which would be induced by a rough polysilicon layer.

A method for planarizing a polysilicon layer of a low-temperature polysilicon device according to the disclosure, comprising:

Step S1: Crystallizing the low-temperature polysilicon device.

Step S2: Forming a flat coating layer on an uneven surface of the polysilicon layer of the crystallized low-temperature polysilicon device through a coating process.

Step S3: Curing the flat coating layer.

Step S4: Removing the cured flat coating layer and the polysilicon protrusion through a removing process to form a flat surface of the polysilicon layer.

Preferably, in the step S2, the coating process is a PI (polyimide) coating process.

Preferably, in the step S2, a PI-coated organic layer is in a sol state.

Preferably, the removing process is a dry etching method.

Preferably, the gas used for the dry etching method is a mixed gas of $O_2$ and $CF_4$, and 80%-95% of the mixed gas is $CF_4$.

Preferably, the removing process is a wet etching process.

Preferably, the removing process is a wet stripping process.

By the foregoing method, the surface of the rough and uneven polysilicon layer can be well-planarized. As a result, the problems of a broken film, unclean etching, or tip discharge, which would be induced by a rough polysilicon layer, are mitigated. Therefore, the production yield of the low-temperature polysilicon device is improved.

Another objective of the disclosure is to provide a method for forming a low-temperature polysilicon device. A polysilicon layer of the low-temperature polysilicon device is flattened by the above-mentioned method for planarizing a low-temperature polysilicon layer, By the foregoing method, the yield of the low-temperature polysilicon device is higher.

Additional aspects and advantages of the disclosure in part will be provided in the following description, and in part will become apparent from the following description, or will be understood through the realization of the disclosure.

BRIEF DESCRIPTION OF THE DRAWINGS

The foregoing and/or additional aspects and advantages of the disclosure will become apparent and easy to understand from the description of the embodiments taken in combination with the following accompanying drawings, in which.

DETAILED DESCRIPTION OF PREFERRED EMBODIMENTS

Figure 1:
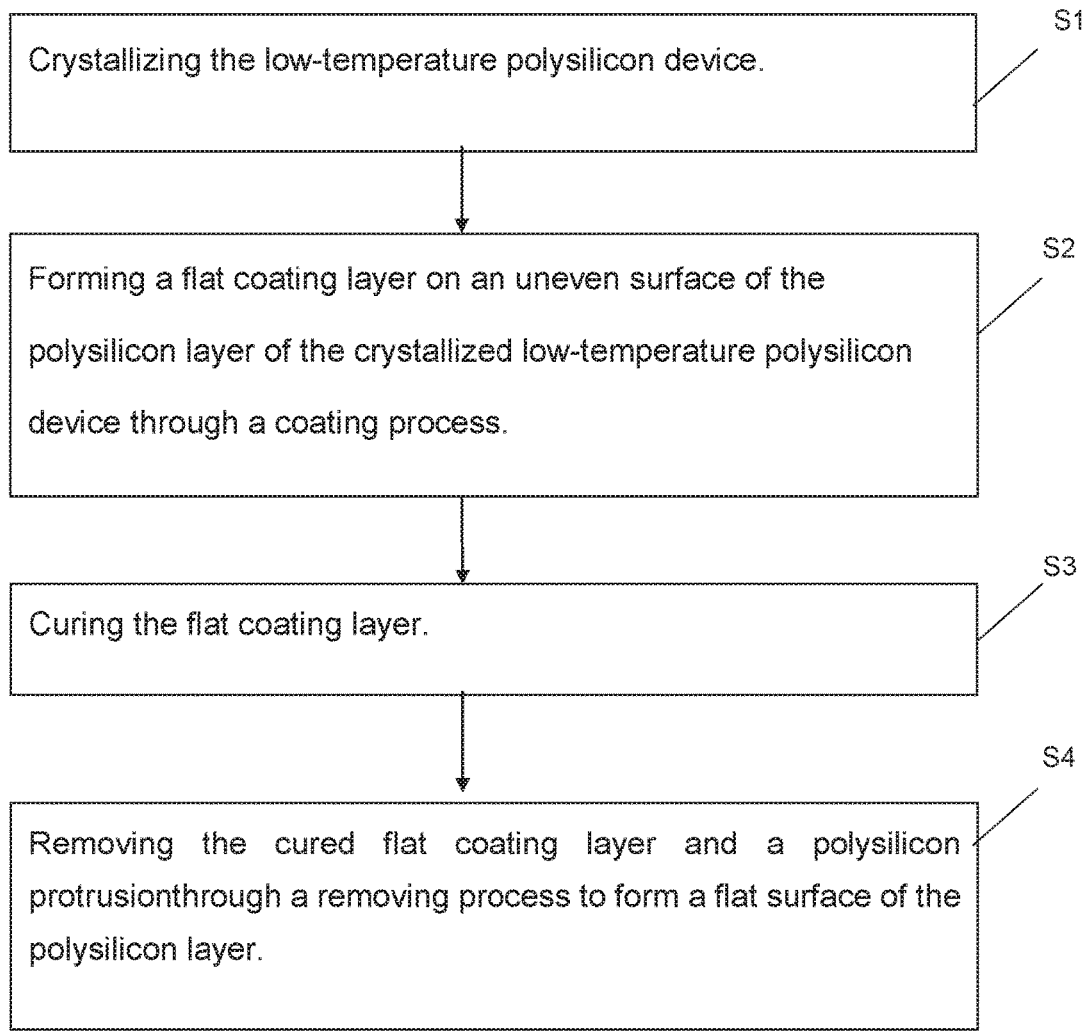
FIG. 1 shows a method for planarizing a polysilicon layer of a low-temperature polysilicon device according to an embodiment of the disclosure.

The embodiments of the disclosure are described in detail below. The examples of the embodiments are shown in the drawings. From the beginning to the end of the descriptions, the same or similar reference numerals represent the same or similar elements, or elements having the same or similar functions. The embodiments described below with reference to the accompanying drawings are exemplary. They are intended to explain the disclosure and should not be construed as limiting the disclosure.

The embodiments of the disclosure provide a method for packaging an organic electroluminescent device. In the embodiment, it can be better to solve the quality problem of films in the prior art. The problem is resulted from high material cost, difficult maintenance, and non-in time cleaning due to the packaging method required to use the mask.

FIG. 1 is a flowchart of a packaging method according to an embodiment of the disclosure.

Figure 2:
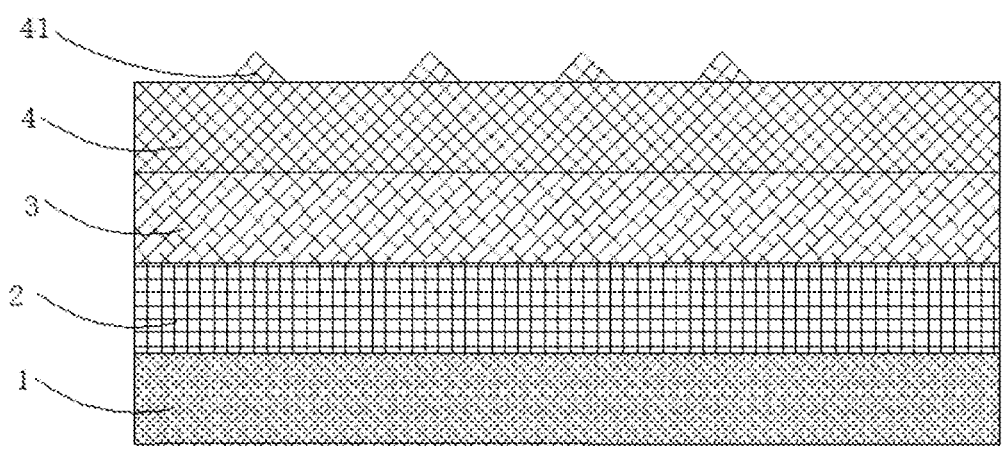
FIG. 2 is a schematic structural diagram of a polysilicon layer of a low-temperature polysilicon device before planarization according to an embodiment of the disclosure.
Figure 3:
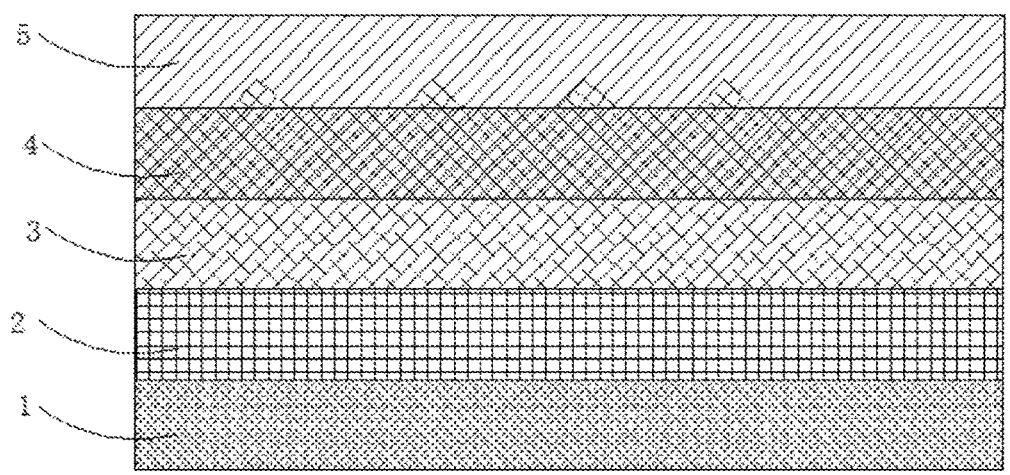
FIG. 3 is a schematic structural diagram of a polysilicon layer of a low-temperature polysilicon device after a coating process according to an embodiment of the disclosure.
Figure 4:
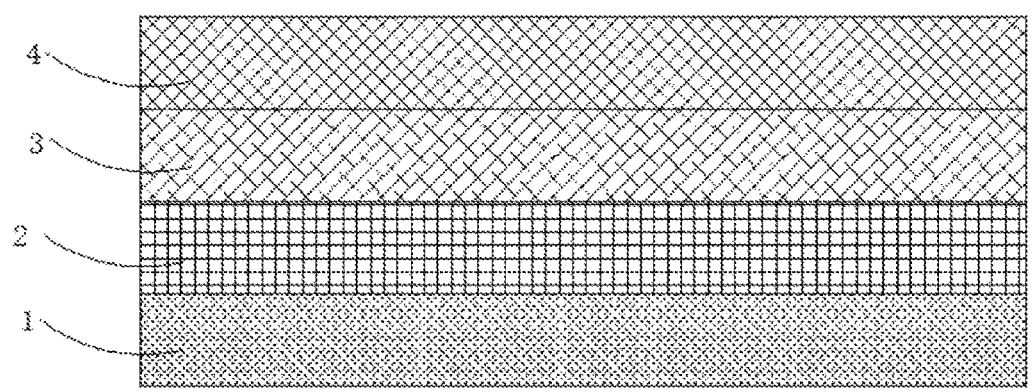
FIG. 4 is a schematic structural diagram of a polysilicon layer of a low-temperature polysilicon device after planarization according to an embodiment of the disclosure.

FIG. 2, FIG. 3 and FIG. 4 are individually schematic structural diagrams of a planarization process of a low-temperature polysilicon device according to an embodiment of the disclosure.

The low-temperature polysilicon device mentioned in the embodiments of the disclosure is generally used in the display field. The current display using a low-temperature polysilicon device has advantages including thinner, smaller and lower power consumption. Its structure is simple and has higher stability.

As shown in FIG. 1 to FIG. 4, a low-temperature polysilicon device according to an embodiment of the disclosure comprises a glass layer 1, an organic layer 2 disposed on the glass layer 1, a buffer layer 3 disposed on the organic layer 2, and a polysilicon layer 4 on the buffer layer 3. Before planarization, the polysilicon layer 4 comprises some polysilicon protrusions 41 thereon. Therefore, the purpose of the method for planarizing the polysilicon layer 4 of the low-temperature polysilicon device of the disclosure is to remove the polysilicon protrusions 41. The method comprises:

Step S1: Crystallizing the low-temperature polysilicon device.

Step S2: Forming a flat coating layer 5 on an uneven surface of the polysilicon layer 4 of the crystallized low-temperature polysilicon device through a coating process.

Step S3: Curing the flat coating layer 5.

Step S4: Removing the cured flat coating layer 5 and the polysilicon protrusions 41 through a removing process to form a flat surface of the polysilicon layer 4.

By the foregoing method, the surface of the rough and uneven polysilicon layer 4 can be well-planarized. As a result, the problems of a broken film, unclean etching, or tip discharge, which would be induced by a rough polysilicon layer 4, are mitigated. Therefore, the production yield of the low-temperature polysilicon device is improved.

Preferably, in the step S2, the coating process is a PI coating process. The PI-coated coating layer is in a sol state. By using the PI coating process, the formed coating layer 5 can be more uniform. The PI-coated coating layer 5 is in a sol state such that the coating layer 5 can be sufficiently in contact with the surface of the polysilicon layer 4. Moreover, using the PI coating process makes the surface of the low-temperature polysilicon flat. Preferably, the removing process is a dry etching method. The gas used for the dry etching method is a mixed gas of $O_2$ and $CF_4$. 80%-95% of the mixed gas is $CF_4$. The removal rate of $O_2$ is 400 nm/min. $O_2$ is used to remove the coating layer 5. The removal rate of $CF_4$ is 80 nm/min. $CF_4$ is used to remove the polysilicon protrusions 41. Therefore, the removing rates of the coating layer 5 and the polysilicon protrusions 41 can reach consistent by using the mixed gas with the above ratio. As a result, a better removal operation is achieved. The planarization of the surface of the polysilicon layer 4 is realized.

As another embodiment, the removing process is a wet etching process.

As another embodiment, the removing process is a wet stripping process.

Another objective of the disclosure is to provide a method for forming a low-temperature polysilicon device. The polysilicon layer 4 of the low-temperature polysilicon device is flattened by the above-mentioned method for planarizing a low-temperature polysilicon layer. By the foregoing method for forming a low-temperature polysilicon device, the yield is higher. The production and operation efficiency is enhanced.

In the description of the specification, the description of reference terms "one embodiment", "some embodiments", "an example", "a specific example", "some examples", etc., mean that the specific features, structures, materials, or characteristics described in connection with the embodiments or examples are included in at least one embodiment or example of the disclosure. In the specification, the schematic expression of the above terms does not necessarily refer to the same embodiment or example. Furthermore, the described specific features, structures, materials, or characteristics may be combined into any one or more embodiments or examples in any suitable way.

Although the embodiments of the disclosure have been shown and described above, it should be understood that the above embodiments are merely exemplary and should not be construed as limiting the disclosure. A person of ordinary skill in the art may make variations, modifications, substitutions and transformation to the above embodiments within the scope of the disclosure, without departing from the principles and objectives of the disclosure.

What is claimed is:

1. A method for planarizing a polysilicon layer of a low-temperature polysilicon device, comprising:
   a step S1, comprising crystallizing the low-temperature polysilicon device;
   a step S2, comprising forming a flat coating layer on an uneven surface of the polysilicon layer of the crystallized low-temperature polysilicon device through a coating process;
   a step S3, comprising curing the flat coating layer; and
   a step S4, comprising removing the cured flat coating layer and a polysilicon protrusion through a removing process to form a flat surface of the polysilicon layer.

2. The method for planarizing a polysilicon layer of a low-temperature polysilicon device as claimed in claim 1, wherein in the step S2, the coating process is a PI (polyimide) coating process.

3. The method for planarizing a polysilicon layer of a low-temperature polysilicon device as claimed in claim 2, wherein in the step S2, a PI-coated organic layer is in a sol state.

4. The method for planarizing a polysilicon layer of a low-temperature polysilicon device as claimed in claim 1, wherein the removing process is a dry etching method.

5. The method for planarizing a polysilicon layer of a low-temperature polysilicon device as claimed in claim 4, wherein a gas used for the dry etching method is a mixed gas of $O_2$ and $CF_4$, and 80%-95% of the mixed gas is $CF_4$.

6. The method for planarizing a polysilicon layer of a low-temperature polysilicon device as claimed in claim 1, wherein the removing process is a wet etching process.

7. The method for planarizing a polysilicon layer of a low-temperature polysilicon device as claimed in claim 1, wherein the removing process is a wet stripping process.

8. A method for forming a low-temperature polysilicon device, wherein a polysilicon layer of the low-temperature polysilicon device is planarized by the method as claimed in claim 1.

9. The method for planarizing a polysilicon layer of a low-temperature polysilicon device as claimed in claim 8, wherein in the step S2, the coating process is a PI coating process.

10. The method for planarizing a polysilicon layer of a low-temperature polysilicon device as claimed in claim 9, wherein in the step S2, a PI-coated organic layer is in a sol state.

11. The method for planarizing a polysilicon layer of a low-temperature polysilicon device as claimed in claim 8, wherein the removing process is a dry etching method.

12. The method for planarizing a polysilicon layer of a low-temperature polysilicon device as claimed in claim 11, wherein a gas used for the dry etching method is a mixed gas of $O_2$ and $CF_4$, and 80%-95% of the mixed gas is $CF_4$.

13. The method for planarizing a polysilicon layer of a low-temperature polysilicon device as claimed in claim 8, wherein the removing process is a wet etching process.

14. The method for planarizing a polysilicon layer of a low-temperature polysilicon device as claimed in claim 8, wherein the removing process is a wet stripping process.

\* \* \* \* \*